(12) United States Patent
Behziz et al.

(10) Patent No.: US 9,780,459 B1
(45) Date of Patent: Oct. 3, 2017

(54) LINKING CABLE CONNECTOR

(71) Applicant: TYCO ELECTRONICS CORPORATION, Berwyn, PA (US)

(72) Inventors: Arash Behziz, Newbury Park, CA (US); Michael David Herring, Apex, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/084,654

(22) Filed: Mar. 30, 2016

(51) Int. Cl.
| | |
|---|---|
| H02G 15/02 | (2006.01) |
| H02G 3/00 | (2006.01) |
| H02G 15/04 | (2006.01) |
| H01R 24/00 | (2011.01) |
| H01R 13/40 | (2006.01) |
| H01R 4/02 | (2006.01) |
| H05K 1/02 | (2006.01) |
| H05K 1/11 | (2006.01) |

(52) U.S. Cl.
CPC .......... *H01R 4/021* (2013.01); *H05K 1/0296* (2013.01); *H05K 1/11* (2013.01)

(58) Field of Classification Search
CPC ......... H01R 4/021; H05K 1/11; H05K 1/0296
USPC .......... 439/660, 733.1; 174/70 R, 74 R, 75 R
See application file for complete search history.

(56) References Cited

U.S. PATENT DOCUMENTS

| | | | | |
|---|---|---|---|---|
| 5,295,868 A * | 3/1994 | Viaud | ............... | H01R 13/6593 174/74 R |
| 5,844,783 A * | 12/1998 | Kojima | ............... | H05K 1/0219 174/261 |
| 5,975,944 A * | 11/1999 | Medina | ............... | H01R 9/0515 439/493 |
| 8,333,617 B2 * | 12/2012 | Fjelstad | ............... | H01R 13/05 439/660 |
| 2008/0293266 A1* | 11/2008 | Kanazawa | ........... | H01R 13/641 439/74 |
| 2013/0065456 A1* | 3/2013 | Starke | ................... | H01R 43/24 439/701 |
| 2013/0318786 A1* | 12/2013 | Nakamura | ............... | G01D 1/00 29/876 |

* cited by examiner

*Primary Examiner* — Sherman Ng

(57) ABSTRACT

Linking cable connector includes a lead frame held in an interior cavity of a cover. The lead frame includes conductive leads arranged side by side in a row and extending between a first end and an opposite second end of the lead frame. At least some adjacent conductive leads are spaced on a first lead pitch at the first end, and are spaced on a second lead pitch at the second end. The second lead pitch is less than the first lead pitch. The conductive leads engage and electrically connect to corresponding wire conductors of a first cable harness at the first end of the lead frame, and the conductive leads engage and electrically connect to corresponding wire conductors of a second cable harness at the second end of the lead frame such that the leads provide conductive paths between the first and second cable harnesses.

20 Claims, 3 Drawing Sheets

LINKING CABLE CONNECTOR

BACKGROUND

The subject matter herein relates generally to cable connectors that provide electrical links or pathways to connect two electrical cable harnesses.

Electrical performance characteristics of electrical cables vary among cables of different wire sizes, referring to the diameter of the wire conductors of a cable. For example, cables with larger wire sizes typically have better electrical loss characteristics (e.g., less energy lost to resistance) than cables with relatively smaller wire sizes, since the larger size wires have larger cross-sectional areas along which to convey current. In applications in which one or more electrical cables are used to convey electrical signals over a relatively long distance between two or more devices or systems, cables having larger wire sizes may be preferable over cables with smaller wire sizes due to the better loss characteristics in the larger wires.

As the wire size of a cable increases, the cable also generally becomes less flexible. An application may require an end of the cable to be routed through a narrow passageway through a case in order to terminate to a device within the case, so it may be preferable to use a cable with a smaller wire size in such an application due to the increased flexibility relative to a larger wire size cable. Additionally, an increased wire size may make a cable more difficult to terminate the wire conductors to a device having a relatively small pitch between contacts of the device. For example, larger wire conductors may have a larger center-to-center pitch between the centers of adjacent wire conductors than smaller wire conductors. Some devices may be configured to electrically connect to wire conductors having a certain pitch or ranges of pitches, such that the devices may be impedance-matched to such wire conductors. Thus, cables having large wire sizes may have a pitch between wire conductors that is greater than the device is configured to accept. Therefore, whereas cables with larger wire sizes may provide better loss characteristics than cables with smaller wire sizes, the larger wire size cables may be less flexible and/or less able to interface with certain devices than smaller wire size cables. Various applications may call for a cable that extends a distance between a first electrical device and a second electrical device in order to electrically connect the first and second electrical devices. The distance may be sufficiently long to warrant using a cable with a relatively large wire size to reduce electrical loss. But, the first and/or second electrical devices may be configured to electrically connect to a cable with a smaller wire size due to the contact pitches of the devices or an amount of flexibility required to access the devices within respective cases. Thus, a larger wire size cable may be preferable between the two devices, but a smaller wire size cable may be preferable for making the electrical connections to the two devices.

Accordingly, a need exists for electrically connecting a first cable having a larger wire size to a second cable having a smaller wire size.

BRIEF DESCRIPTION

In an embodiment, a linking cable connector is provided that includes a cover and a lead frame. The cover defines an interior cavity, and the lead frame is held in the interior cavity of the cover. The lead frame includes a plurality of conductive leads arranged side by side in a row. The conductive leads extend a length between a first wire interface end and an opposite second wire interface end of the lead frame. At least some adjacent conductive leads are spaced on a first lead pitch at least proximate to the first wire interface end of the lead frame and are configured to engage and electrically connect to corresponding wire conductors of a first cable harness. The at least some adjacent conductive leads are spaced on a second lead pitch at least proximate to the second wire interface end of the lead frame and are configured to engage and electrically connect to corresponding wire conductors of a second cable harness. The second lead pitch is less than the first lead pitch. The conductive leads are configured to provide conductive paths between the wire conductors of the first cable harness and the wire conductors of the second cable harness.

In an embodiment, a linking cable connector is provided that includes a cover defining an interior cavity and a lead frame held in the interior cavity of the cover. The lead frame extends along a longitudinal axis between a first wire interface end and an opposite second wire interface end. The lead frame defines a wide span region that includes the first wire interface end, a narrow span region that includes the second wire interface end, and a transition region disposed between the wide span region and the narrow span region along the longitudinal axis. The lead frame includes a plurality of conductive leads arranged side by side in a row along a lateral axis. The conductive leads extend between the first and second wire interface ends of the lead frame. At least some adjacent conductive leads are spaced on a first lead pitch along the wide span region, and the at least some adjacent conductive leads are spaced on a second lead pitch along the narrow span region. The second lead pitch is less than the first lead pitch. The conductive leads along the wide span region are configured to engage and electrically connect to corresponding wire conductors of a first cable harness, and the conductive leads along the narrow span region are configured to engage and electrically connect to corresponding wire conductors of a second cable harness. The conductive leads provide conductive paths between the wire conductors of the first cable harness and the wire conductors of the second cable harness.

In an embodiment, a linking cable connector is provided that includes a cover defining an interior cavity and an array of electrical conductors held in the interior cavity of the cover. The array of electrical conductors extends longitudinally between a first wire interface end and an opposite second wire interface end. The array of conductors defines a wide span region that includes the first wire interface end, a narrow span region that includes the second wire interface end, and a transition region disposed between the wide span region and the narrow span region. The electrical conductors in the array each extend the length of the array between the first wire interface end and the second wire interface end and are laterally spaced apart from one another in a row. The electrical conductors along the wide span region have a first pitch between adjacent electrical conductors, and the electrical conductors along the narrow span region have a second pitch between adjacent electrical conductors that is less than the first pitch. The transition region extends between a wide end and an opposite narrow end. The electrical conductors at the wide end have the first pitch between adjacent electrical conductors. The electrical conductors at the narrow end have the second pitch between adjacent electrical conductors. The electrical conductors extend linearly between the wide end and the narrow end of the transition region. The electrical conductors along the wide span region are configured to engage and electrically connect to corresponding wire conductors of a first cable harness, and the electrical conductors along the narrow span region are configured to engage and electrically connect to corresponding wire conductors of a second cable harness. Each electrical conductor provides a conductive path between one of the wire conductors of the first cable harness and a corresponding wire conductor of the second cable harness.

DETAILED DESCRIPTION

Embodiments set forth herein include cable assemblies and cable connectors that may form part of the cable assemblies. The cable connectors may be configured to satisfy certain mechanical requirements. For example, the cable connectors may be configured to electrically engage multiple cables that have different wire conductor sizes and/or center-to-center pitches between wire conductors. The cable connectors may also be able to satisfy certain electrical requirements. For example, the cable connectors may be configured to transmit data signals at high speeds, such as 10 gigabits per second (Gbps) or greater, while achieving a sufficient level of signal integrity. Moreover, the components of one or more embodiments set forth herein may enable the manufacture of cable connectors that are capable of achieving the desired mechanical and electrical requirements.

As used herein, phrases such as "a plurality of [elements]" and "an array of [elements]" and the like, when used in the detailed description and claims, do not necessarily include each and every element that a component may have. For example, the phrase "a plurality of conductors [being/having a recited feature]" does not necessarily mean that each and every conductor has the recited feature. Other conductors may not include the recited feature. Accordingly, unless explicitly stated otherwise (e.g., "each and every cable of the cable connector"), embodiments may include similar elements that do not have the recited features. Likewise, unless explicitly stated otherwise, when a component is recited as having certain elements, the component is permitted to have additional elements. For example, although a connector body may be described as having a front housing and a rear housing in the illustrated embodiment, the connector body may also include another housing part in addition to the front and rear housings.

Figure 1:
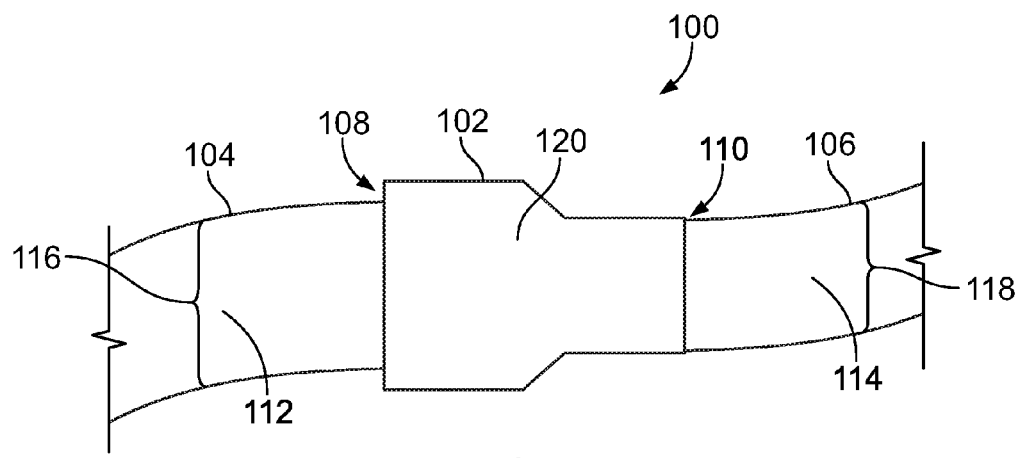
FIG. 1 illustrates a cable assembly formed in accordance with an embodiment.

FIG. 1 illustrates a cable assembly 100 formed in accordance with an embodiment. The cable assembly 100 includes a linking cable connector 102, a first cable harness 104, and a second cable harness 106. The first and second cable harnesses 104, 106 are coupled to the linking cable connector 102. The linking cable connector 102 includes a connector housing 120 that extends between a first cable end 108 and a second cable end 110. The first and second cable harnesses 104, 106 are electrically connected to conductive elements of the linking cable connector 102 held within the connector housing 120, as described in greater detail below.

The first cable harness 104 extends from the first cable end 108, and the second cable harness 106 extends from the second cable end 110. The linking cable connector 102 is configured to provide an electrically conductive pathway between the first and second cable harnesses 104, 106 to electrically connect the first and second cable harnesses 104, 106 to one another. For example, electrical power and/or data signals conveyed through the first cable harness 104 are transmitted through the linking cable connector 102 to the second cable harness 106 and vice-versa. The linking cable connector 102 may be referred to herein as linking electrical connector 102, electrical connector 102, or connector 102.

The first and second cable harnesses 104, 106 each include a plurality or bundle of respective individual cables 144, 154 (shown in FIG. 2) and a respective outer jacket 112, 114 that surrounds the individual cables 144, 154. The cable assembly 100 optionally may include strain-relief boots (not shown) that surrounds the jackets 112, 114 at the corresponding ends 108, 110 of the cable connector 102 to provide strain relief.

Figure 2:
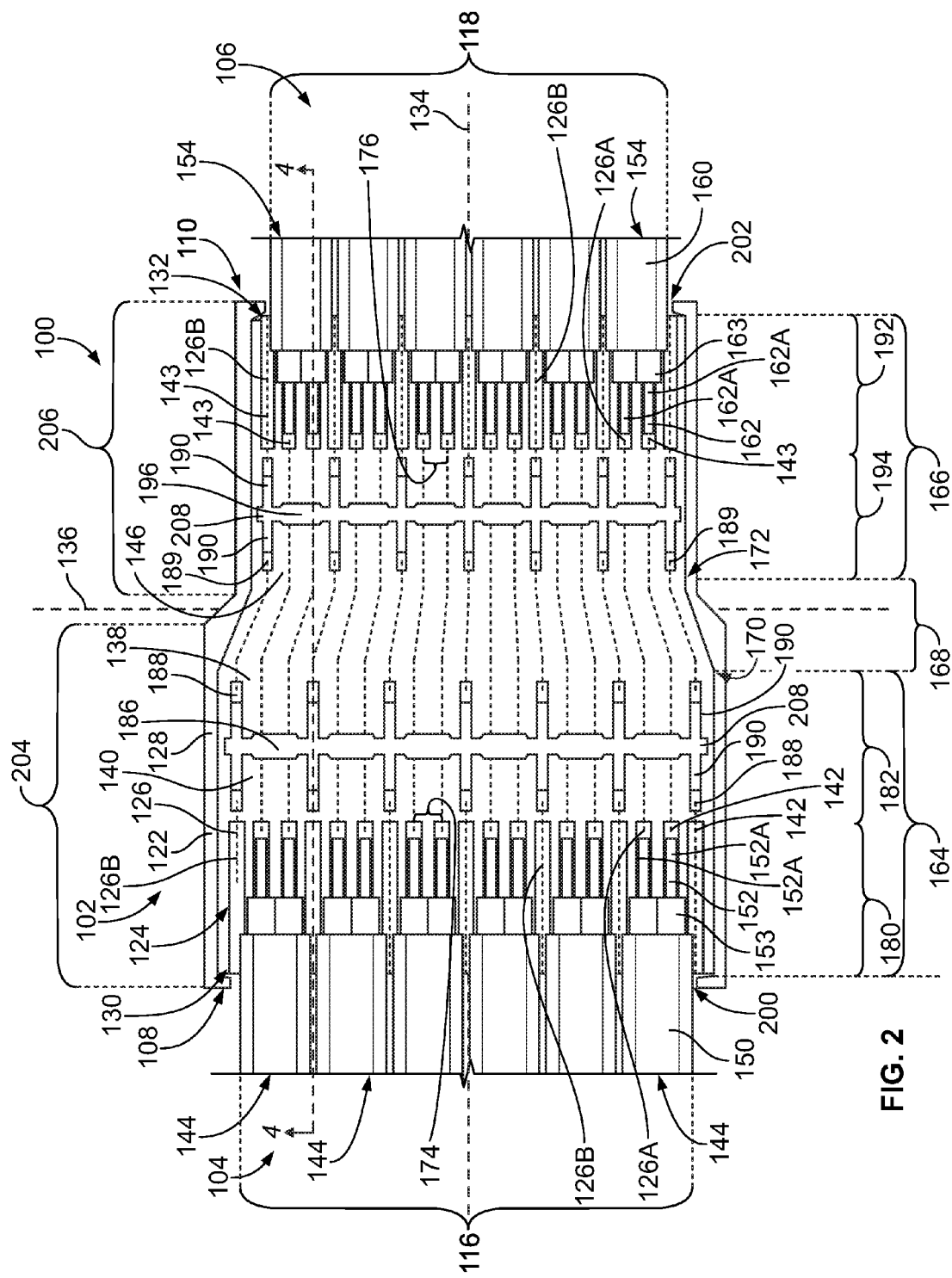
FIG. 2 is a plan view of the cable assembly according to an embodiment.

In an exemplary embodiment shown in FIG. 2, the cables 144 of the first cable harness 104 include wire conductors 152 that have a larger wire size than wire conductors 162 of the cables 154 of the second cable harness 106. As used herein, wire size may refer to a cross-sectional area of a wire conductor, a diameter of a wire conductor, a surface area of wire conductor, or the like. Wire size may be measured and/or categorized in terms of wire gauge. Typically a larger wire size has a smaller wire gauge than a smaller wire size. The first cable harness 104 has a greater lateral width 116 than the lateral width 118 of the second cable harness 106. Assuming the first cable harness 104 and the second cable harness 106 have approximately the same number of wire conductors 152, 162 therein, since the wire conductors 152 of the first cable harness 104 are larger than the wire conductors 162 of the second cable harness 106, the first cable harness 104 has an overall greater width 116 than the width 118 of the second cable harness 106.

In one example application, the cable assembly 100 is used to provide an electrically conductive path between a first electrical device (not shown) and a second electrical device (not shown). The first electrical device is electrically connected to a distal end (not shown) of the first cable harness 104, and the second electrical device is electrically connected to a distal end of the second cable harness 106. The first electrical device may be configured to be terminated to wire conductors of the same or a similar pitch and/or wire size as the wire conductors 152 of the cables 144 in the first cable harness 104. The second electrical device may be configured to be terminated to wire conductors of the same or a similar pitch and/or wire size as the wire conductors 162 of the cables 154 in the second cable harness 106, which are smaller and have a reduced pitch relative to the wire conductors 152 of the first cable harness 104. The linking cable connector 102 electrically connects the first cable harness 104 to the second cable harness 106 end-to-end in order to provide a conductive signal path between the first and second devices, while ensuring that proper wire conductors are terminated to each of the respective devices.

In another example application, the cable assembly 100 also provides an electrically conductive path between two electrical devices that are not shown. In this application, both electrical devices are configured to be terminated to cables having relatively small wire conductors, such as the cables 154 of the second cable harness 106, for flexibility in routing and/or for matching a relatively small contact pitch of the devices. But, the two devices may be separated by a significant distance such that routing the second cable harness 106 the full length would result in significant electrical loss due to resistance in the wire conductors 162. In an embodiment, the second cable harness 106 is terminated at a distal end (not shown) to a first of the electrical devices, and another cable harness (not shown) that is similar to the second cable harness 106 is terminated to the second of the electrical devices. The linking cable connector 102 is a first linking connector that connects the second cable harness 106 to the first cable harness 104. The first cable harness 104 spans a majority of the distance between the two devices, and a distal end (not shown) of the first cable harness 104 is connected to a second linking cable connector (not shown) that is similar to the illustrated linking connector 102. The second linking cable connector electrically connects the first cable harness 104 to the other cable harness that is terminated to the second device. Thus, the cable harnesses with the smaller wire sizes are used at the ends of the signal path for terminating to the electrical devices, and the cable harness with the larger wire size is used to reduce electrical loss along a middle portion of the signal path between the devices.

FIG. 2 is a plan view of the cable assembly 100 according to an embodiment. For reference, the cable connector 102 is oriented with respect to a longitudinal axis 134 and a lateral axis 136 that is perpendicular to the longitudinal axis 134. It is noted that the cable connector 102 may have any orientation with respect to gravity. The cable connector 102 includes a cover 122 and an array 124 of conductors 126. In an embodiment, the cover 122 is composed of a top cover member 127 (shown in FIG. 4) and a bottom cover member 128 that are configured to engage one another to define the assembled cover 122. The top cover member 127 is not shown in order for the array 124 of conductors 126 to be visible, as the array 124 of conductors 126 are held in an interior cavity 198 (shown in FIG. 4) of the cover 122. As used herein, relative or spatial terms such as "top," "bottom," "first," "second," "left," and "right" are only used to distinguish the referenced elements and do not necessarily require particular positions or orientations in the cable assembly 100, the cable connector 102, or the surrounding environment of the cable assembly 100. The cover 122 in an embodiment is discrete from the connector housing 120 (shown in FIG. 1) and is held within the connector housing 120. The cover 122 extends between the first cable end 108 and the second cable end 110 of the cable connector 102. In an alternative embodiment, the cover 122 defines the connector housing 120, such that the cover 122 defines an outer perimeter of the cable connector 102.

The array 124 of electrical conductors 126 extend longitudinally between a first wire interface end 130 and an opposite second wire interface end 132. The first wire interface end 130 is at or proximate to the first cable end 108 of the cable connector 102, and the second wire interface end 132 is at or proximate to the second cable end 110 of the cable connector 102. In an embodiment, each of the conductors 126 extends the full length of the array 124 between the first wire interface end 130 and the second wire interface end 132. The electrical conductors 126 are laterally spaced apart from one another along the lateral axis 136, such that the electrical conductors 126 are arranged in a row. The conductors 126 may be held to extend co-planar with one another.

In an exemplary embodiment, the electrical conductors 126 are conductive leads 126 of a lead frame 138. The electrical conductors 126 are referred to herein as conductive leads 126. The lead frame 138 extends between the first wire interface end 130 and the second wire interface end 132. The lead frame 138 includes the conductive leads 126 and a frame body or layer 140 that surrounds the conductive leads 126. The conductive leads 126 are formed of a conductive metal material, such as a copper alloy. The conductive leads 126 of the lead frame 138 may have been formed on a common carrier strip, with the carrier strip subsequently being dissociated from the conductive leads 126 such that the leads 126 in the assembled state in the cover 122 are not electrically connected to one another. The frame body 140 may be a dielectric material that surrounds each of the conductive leads 126 individually to provide electrical insulation between the leads 126. The conductive leads 126 may be held in fixed positions relative to one another by the frame body 140. The frame body 140 may be molded around the array 124 of conductive leads 126 through, for example, an overmolding process. At least portions of the leads 126 may be encased within the frame body 140. Other portions of the conductive leads 126 may be exposed through the frame body 140 to define contact areas for electrical connections. The frame body 140 includes a top side 146 and a bottom side 148 (shown in FIG. 4).

In an alternative embodiment, instead of being conductive leads, the electrical conductors 126 may be electrical traces defined along one side of a printed circuit board (not shown). The printed circuit board is held within the cover 122 and extends between the first wire interface end 130 and the second wire interface end 132. The traces of the circuit board may have the same or a similar geometry as the geometry of the conductive leads described below.

The first cable harness 104 includes a plurality or bundle of individual cables 144 held within the outer jacket 112 (shown in FIG. 1). Each cable 144 includes a shield layer 150, an insulation layer 153, and at least one wire conductor 152. In an embodiment, the wire conductors 152 include signal conductors 152A and ground conductors 152B (shown in FIG. 4). The signal conductors 152A may be used to convey data and/or power. The ground conductors 152B provide a conductive ground path along the cables 144. At least one signal conductor 152A is surrounded by the insulation layer 153, which is itself surrounded by the shield layer 150. Each cable 144 may include a ground conductor 152B or drain wire that is disposed between the shield layer 150 and the insulation layer 153 or is disposed external of the shield layer 150. The second cable harness 106 also includes a plurality or bundle of cables 154 held within the respective outer jacket 114 (shown in FIG. 1). Like the cables 144 of the first cable harness 104, each of the cables 154 of the second cable harness 106 includes a shield layer 160, an insulation layer 163 and at least one wire conductor 162. The wire conductors 162 include signal conductors 162A and ground conductors (not shown).

In some embodiments, the cables 144 and/or the cables 154 are twin-axial cables each having a pair of the respective signal wire conductors 152A, 162A extending parallel to each other throughout the length of the corresponding cable 144, 154. Alternatively, the pair of signal wire conductors 152A, 162A may be helically twisted around a center axis of the corresponding cable 144, 154. In alternative embodiments, the cables 144 and/or the cables 154 may include only one signal conductor or more than two signal conductors.

The wire conductors 152 of the cables 144 of the first cable harness 104 are terminated (for example, mechanically and electrically connected) to the corresponding conductive leads 126 at or proximate to the first wire interface end 130 of the lead frame 138. For example, the lead frame 138 defines termination contact areas 142 located at or proximate to the first wire interface end 130 in which the conductive leads 126 are exposed through the dielectric frame body 140 in order to directly mechanically engage the wire conductors 152. Similarly, the wire conductors 162 of the cables 154 of the second cable harness 106 are terminated to the corresponding conductive leads 126 at termination contact areas 143 located at or proximate to the second wire interface end 132 of the lead frame 138. The wire conductors 152, 162 terminate to the conductive leads 126 to provide metal-to-metal mating interfaces. For example, the wire conductors 152, 162 may be laser-welded to the corresponding termination contact areas 142, 143 of the conductive leads 126, or alternatively may be soldered to the conductive leads 126. Optionally, the conductive leads 126 may include mating protrusions (not shown) at the termination contact areas 142, 143 that are configured to extend out of the plane of the conductive leads 126 to engage the corresponding wire conductors 152, 162. The mating protrusions may be deflectable contact beams. In another embodiment, the conductive leads 126 may indirectly engage the corresponding wire conductors 152, 162 at the termination contact areas 142, 143 via discrete conductive elements, such as contact pads, located between the leads 126 and the wire conductors 152, 162.

The conductive leads 126 that are terminated to the signal conductors 152A of the first cable harness 104 and to the signal conductors 162A of the second cable harness 106 are referred to as signal leads 126A. Each signal lead 126A is terminated to one of the signal conductors 152A of the first cable harness 104 and one of the signal conductors 162A of the second cable harness 106 to provide a conductive signal path between the two signal conductors 152A, 162A. The conductive leads 126 that are terminated to the ground conductors 152B (shown in FIG. 4) of the first cable harness 104 and the ground conductors (not shown) of the second cable harness 106 are ground leads 126B. Each ground lead 126B is terminated to one of the ground conductors 152B of the first cable harness 104 and one of the ground conductors of the second cable harness 106 to provide a conductive ground path therebetween. The signal leads 126A and the ground leads 126B are arranged along the row of conductive leads 126 in a repeating sequence or pattern (along the lateral axis 136). In the illustrated embodiment, the sequence is ground-signal-signal-ground-signal-signal-ground such that a single ground lead 126B extends between two adjacent pairs of signal leads 126A. The lead frame 138 may define other repeating sequences of signal leads 126A and ground leads 126B in other embodiments, such as alternating signal leads 126A and ground leads 126B or two ground leads 126B disposed between two adjacent pairs of signal leads 126A.

In an exemplary embodiment, the lead frame 138 (for example, the array 124 of conductors 126) defines a wide span region 164, a narrow span region 166, and a transition region 168 disposed between the wide span region 164 and the narrow span region 166 along the longitudinal axis 134. The wide span region 164 includes the first wire interface end 130 of the lead frame 138 and extends from the first wire interface end 130 to the transition region 168. The narrow span region 166 includes the second wire interface end 132 of the lead frame 138 and extends from the second wire interface end 132 to the transition region 168. A width of the wide span region 164 along the lateral axis 136 is greater than a width of narrow span region 166. The transition region 168 extends between a wide end 170 and an opposite narrow end 172. The wide end 170 is located at the interface between the transition region 168 and the wide span region 164, and the narrow end 172 is located at the interface between the transition region 168 and the narrow span region 166. The width of the transition region 168 at the wide end 170 is the same as the width of the wide span region 164, and the width of the transition region 168 at the narrow end 172 is the same as the width of the narrow span region 166, such that the transition region 168 is wider at the wide end 170 than at the narrow end 172. The wide span region 164 includes the termination contact areas 142. The narrow span region 166 includes the termination contact areas 143.

In an embodiment, at least portions of the conductive leads 126 along the wide span region 164 have a first center-to-center pitch 174 between adjacent conductive leads 126. As used herein, a "pitch between adjacent [conductive elements]" refers to a distance between lateral centers or midpoints of two adjacent conductive elements, not a distance between nearest edges of the two conductive elements. For example, a first pair of conductors may have the same pitch as a second pair of conductors because the distance between centers of the conductors of the first pair may be equal to the distance between centers of the conductors of the second pair, although a spacing between nearest edges of the conductors of the first pair may differ from the spacing between nearest edges of the conductors of the second pair. This result may be due to one or more of the conductors in the first pair having a different width relative to one or more of the conductors in the second pair.

At least portions of the conductive leads 126 along the narrow span region 166 have a second center-to-center pitch 176 that is less than the first center-to-center pitch 174. As used herein, the first center-to-center pitch 174 is referred to as the first lead pitch 174, and the second center-to-center pitch 176 is referred to as the second lead pitch 176. Thus, two particular adjacent conductive leads 126 are spaced on the first lead pitch 174 along at least a portion of the wide span region 164, and the same two conductive leads 126 are spaced on the second lead pitch 176 along at least a portion of the narrow span region 166. In one embodiment, all adjacent conductive leads 126 are spaced on the first lead pitch 174 along at least a portion of the wide span region 164, and all adjacent conductive leads 126 are spaced on the second lead pitch 176 along at least a portion of the narrow span region 166. However, in one or more embodiments, some adjacent leads 126 are not spaced on the first lead pitch 174 along the wide span region 164 and are not spaced on the second lead pitch 176 along the narrow span region 166. For example, two intra-cable adjacent leads 126 that are configured to electrically connect to adjacent signal wire conductors 152A within the same cable 144 are spaced on the first lead pitch 174, but two inter-cable adjacent leads 126 that are configured to electrically connect to adjacent conductors 152 of different cables 144 may be spaced farther apart than the first lead pitch 174. Thus, as used herein, when the conductive leads 126 are described as being spaced on the first lead pitch 174 and/or the second lead pitch 176, this description applies to at least some adjacent leads 126 (for example, the intra-cable adjacent leads 126) but optionally may not apply to every pair of adjacent leads 126 in the lead frame 138.

In an embodiment, the first lead pitch 174 corresponds to a first wire pitch between adjacent wire conductors 152 of the cables 144 in the first cable harness 104, and the second lead pitch 176 corresponds to a second wire pitch between adjacent wire conductors 162 of the cables 154 in the second cable harness 106. More specifically, the first wire pitch corresponds to the pitch between signal conductors 152A in the same cable 144, and the second wire pitch corresponds to the pitch between signal conductors 162A in the same cable 154. The first and second lead pitches 174, 176 may be approximately equal to, or within a designated range of, the respective first and second wire pitches.

In an embodiment, the wire conductors 152 of the cables 144 in the first cable harness 104 have a larger wire size than the wire conductors 162 of the cables 154 in the second cable harness 106. Due to the larger wire size, the first cable harness 104 optionally may be used to provide a longer-distance communication path than the second cable harness 106 due to the lower electrical loss characteristics of the first cable harness 104, as described in the earlier discussion of FIG. 1. The larger wire conductors 152 may have a greater wire pitch between adjacent conductors 152 than the smaller wire conductors 162 because, for example, the larger conductors 152 may require more insulation and/or shielding between adjacent wire conductors 152 than the smaller wire conductors 162. The portions of the conductive leads 126 at or near the first wire interface end 130 that terminate to the larger wire conductors 152 are spaced on the first lead pitch 174 that corresponds to the wire pitch between the wire conductors 152 in the same cable 144 in order for the wire conductors 152 to terminate to the conductive leads 126 on pitch without bending the wire conductors 152 towards or away from one another at the mating interfaces between the wire conductors 152 and the corresponding conductive leads 126. Changing the wire pitch between adjacent wire conductors 152 may change the impedance, which could negatively affect signal integrity. Likewise, the portions of the conductive leads 126 at or near the second wire interface end 132 that terminate to the smaller wire conductors 162 are spaced on the second lead pitch 176 that corresponds to the wire pitch between the wire conductors 162 in the same cable 154 in order for the wire conductors 162 to terminate to the conductive leads 126 on pitch without bending the wire conductors 162 and changing the impedance.

In the transition region 168, the conductive leads 126 at the wide end 170 have the first lead pitch 174 between adjacent conductive leads 126, and the conductive leads 126 at the narrow end 172 of the transition region 168 have the second lead pitch 176. As such, adjacent conductive leads 126 have varying distances (or pitches) between one another along the length of the transition region 168. In an embodiment, the conductive leads 126 extend linearly along the transition region 168 between the wide end 170 and the narrow end 172. Therefore, since the distances vary between linearly-extending adjacent conductive leads 126 along the transition region 168, the adjacent conductive leads 126 extend at non-parallel angles relative to one another, as described in more detail with reference to FIG. 3 below. In an embodiment, the conductive leads 126 extend parallel to one another along the full length of the wide span region 164 and along the full length of the narrow span region 166, such that the conductive leads 126 only extend non-parallel to one another along the transition region 168. Thus, the transition region 168 defines the only area of the lead frame 138 in which the pitch between adjacent conductive leads 126 varies. In addition to the transition region 168, the conductive leads 126 may extend linearly along the wide span region 164 and/or along the narrow span region 166.

In an embodiment, the wide span region 164 of the lead frame 138 includes a cable subsection 180 and a bus bar subsection 182. The bus bar subsection 182 is disposed along the longitudinal length of the lead frame 138 between the cable subsection 180 and the transition region 168. The conductive leads 126 are terminated to the wire conductors 152 of the first cable harness 104 along the cable subsection 180. Thus, the termination contact areas 142 are disposed within the cable subsection 180. The ground leads 126B of the conductive leads 126 are configured to engage and electrically connect to a bus bar 186 along the bus bar subsection 182. The lead frame 138 defines grounding contact areas 188 along the bus bar subsection 182 in which the ground leads 126B, but not the signal leads 126A, are exposed through the frame body 140 to engage contact fingers 190 of the bus bar 186 to electrically common the ground leads 126B. The narrow span region 166 of the lead frame 138 may also define a cable subsection 192 and a bus bar subsection 194 that is disposed between the cable subsection 192 and the transition region 168. The conductive leads 126 are terminated to the wire conductors 162 of the second cable harness 106 along the cable subsection 192, and the ground leads 126B are configured to engage and electrically connect to a bus bar 196 along the bus bar subsection 194. The termination contact areas 143 are therefore disposed within the cable subsection 192, and the bus bar subsection 194 includes grounding contact areas 189.

The bus bars 186, 196 each include contact fingers 190 that extend from a respective base 208. The bases 208 extend across the row of conductive leads 126. Although the bases 208 extend along the lateral axis 136 and perpendicular to the longitudinal axis 134 in the illustrated embodiment, the bases 208 may extend at oblique angles relative to the lateral axis 136 in other embodiments. As shown in more detail with reference to FIG. 4, the fingers 190 and the bases 208 may be non-planar such that distal ends of the fingers 190 and the bases 208 are disposed at different heights relative to the lead frame 138.

The cover 122 extends between the first cable end 108 and the second cable end 110. The cover 122 defines an interior cavity 198 (shown in FIG. 4) that extends through the cover 122 between a first opening 200 at the first cable end 108 and a second opening 202 at the second cable end 110. In an embodiment, the first and second openings 200, 202 are oriented parallel to one another such that the cover 122 has a tube or sleeve-shape. The cables 144 of the first cable harness 104 are received in the interior cavity 198 (to terminate to the lead frame 138 within the interior cavity 198) through the first opening 200. The cables 154 of the second cable harness 106 are received in the interior cavity 198 through the second opening 202. Although not shown in FIG. 2, the outer jackets 112, 114 (both shown in FIG. 1) of the first and second cable harnesses 104, 106 are not received through the corresponding first and second openings 200, 202. The cover 122 defines a wide section 204 and a narrow section 206. The wide section 204 includes the first cable end 108, and the narrow section 206 includes the second cable end 110. The wide span region 164 of the lead frame 138 aligns with and is held along the wide section 204 of the cover 122. The narrow span region 166 of the lead frame 138 aligns with and is held along the narrow section 206.

Figure 3:
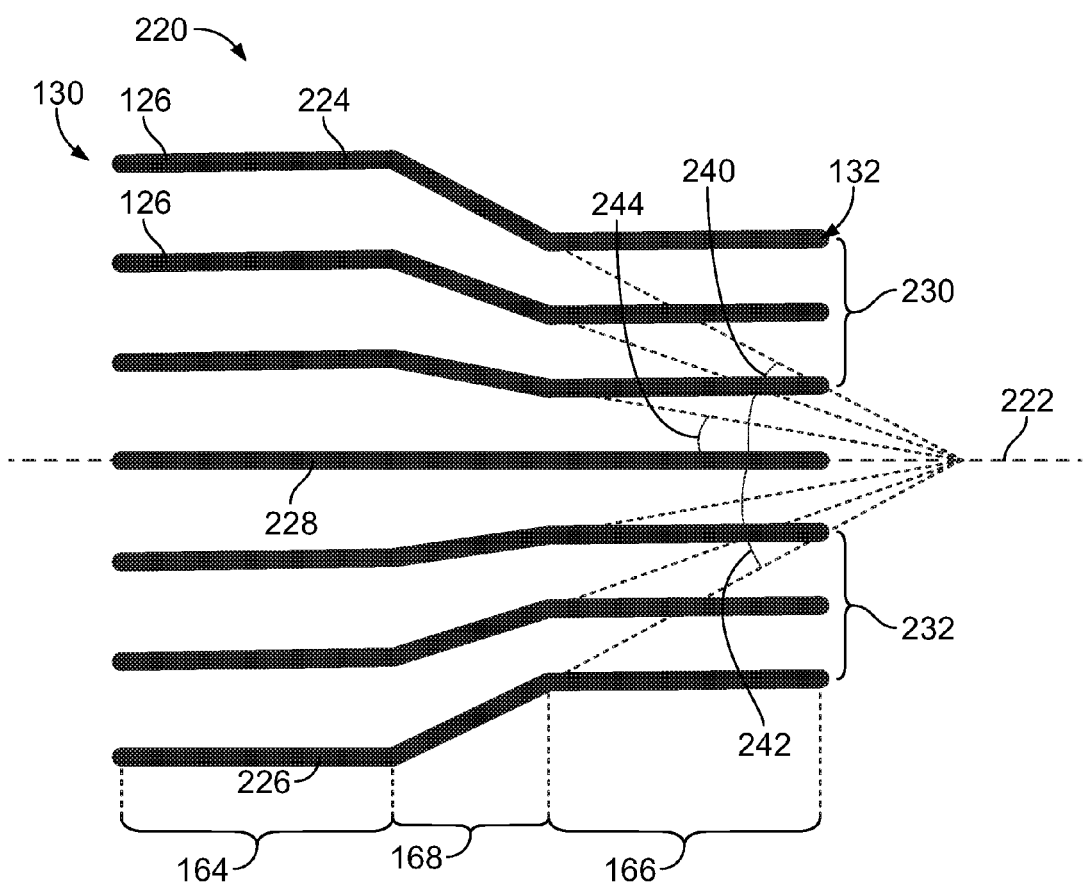
FIG. 3 is a diagram illustrating a conductor array of a cable connector of the cable assembly according to an embodiment.

FIG. 3 is a diagram illustrating an array 220 of the conductors 126 (for example, conductive leads 126) of the cable connector 102 (shown in FIG. 2) according to an embodiment. The illustrated array 220 may be a subset of the array 124 shown in FIG. 2, which includes more than the seven conductive leads 126 shown in FIG. 3. The conductive leads 126 extend between the first and second wire interface ends 130, 132 of the lead frame 138 (shown in FIG. 2) along the wide span region 164, the transition region 168, and the narrow span region 166. In the illustrated embodiment, adjacent conductive leads 126 in the row extend parallel to one another along the wide span region 164 and along the narrow span region 166, and extend at acute angles relative to one another along the transition region 168.

The array 220 defines a center longitudinal axis 222 that bisects the lateral width of the array 220 between a first outer lead 224 on a first side of the center longitudinal axis 222 and a second outer lead 226 on an opposite second side of the center longitudinal axis 222. The center longitudinal axis 222 is parallel to the longitudinal axis 134 shown in FIG. 2. The array 220 optionally includes a center lead 228 that is coaxial to the center longitudinal axis 222. The portions of the conductive leads 126 along the wide span region 164 and along the narrow span region 166 extend parallel to the center longitudinal axis 222. At least most of the conductive leads 126 extend non-parallel to the center longitudinal axis 222 along the transition region 168. The only exception in FIG. 3 is the center lead 228, which is coaxial to the center longitudinal axis 222 in the transition region 168. In an alternative embodiment that does not include a center lead, all of the conductive leads 126 extend non-parallel to the center longitudinal axis 222 in the transition region 168. For example, the conductive leads 126 in a first subset 230 of leads disposed on the first side of the center longitudinal axis 222 (and the center lead 228) have positive slopes relative to the center longitudinal axis 222 in the transition region 168. Inversely, the conductive leads 126 in a second subset 232 of leads disposed on the second side of the center longitudinal axis 222 have negative slopes relative to the center longitudinal axis 222 in the transition region 168.

In an embodiment, the conductive leads 126 extend non-parallel to one another along the transition region 168. The conductive leads 126 in the first and second subsets 230, 232 extend at acute angles relative to the center longitudinal axis 222. For example, the first and second subsets 230, 232 each have progressively increasing angle magnitudes relative to the center longitudinal axis 222 with increasing distance of the conductive leads 126 from the center longitudinal axis 222 in the transition region 168. As such, the first outer lead 224 of the first subset 230 has the largest angle 240 relative to the center longitudinal axis 222 of the leads 126 in the first subset 230, and the second outer lead 226 has the largest angle 242 relative to the center longitudinal axis 222 of the leads 126 in the second subset 232. For example, the angle 240 is greater than the angle 244 between the center longitudinal axis 222 and the conductive lead 126 of the first subset 230 that is adjacent to the center lead 228. The angles 240 and 242 may have equal magnitudes and opposite signs (for example, positive and negative).

Figure 4:
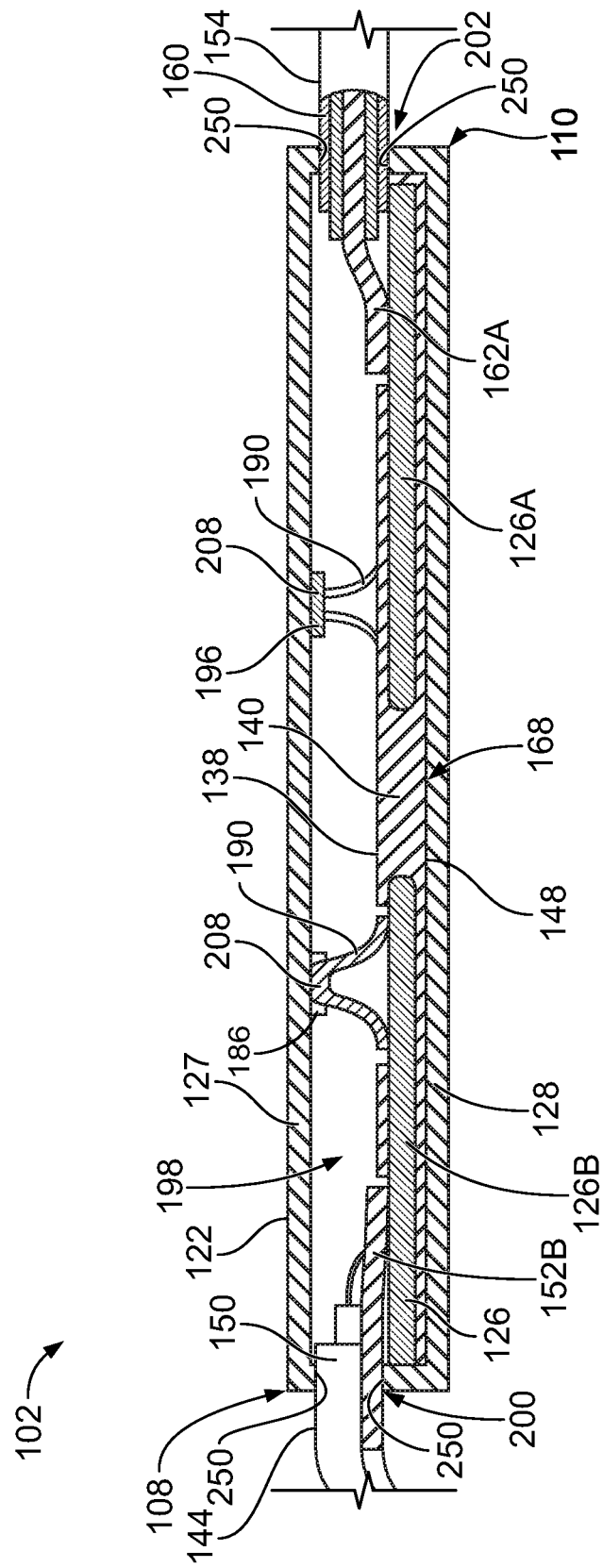
FIG. 4 is a side cross-sectional view of the cable connector according to an embodiment.

FIG. 4 is a side cross-sectional view of the cable connector 102 according to an embodiment. The cross-section is taken along the line 4-4 in FIG. 2. The cross-section extends through a ground lead 126B, the frame body 140, and an adjacent signal lead 126A of the lead frame 138, since the conductive leads 126 are jogged along the transition region 168, as shown in FIG. 2. The ground lead 126B is terminated to a ground conductor 152B (for example, drain wire) of one of the cables 144 of the first cable harness 104 (shown in FIG. 2). The signal lead 126A is terminated to a signal conductor 162A of one of the cables 154 of the second cable harness 106 (FIG. 2).

The cover 122 defines the interior cavity 198 between the top cover member 127 and the bottom cover member 128. In an embodiment, the cover 122 is formed of an electrically conductive metal material. The cover 122 includes shield interfaces 250 at the first and second cable ends 108, 110 of the cover 122. The shield interfaces 250 engage and electrically connect to shield elements (for example, the shield layers 150, 160) of the cables 144, 154. Therefore, the cover 122 is configured to be electrically connected to the shielding elements of the cables 144, 154 of the first and second cable harnesses 104, 106 (shown in FIG. 2), respectively. The shield interfaces 250 in the illustrated embodiment are edges of the top and bottom cover members 127, 128 that define the first and second openings 200, 202. The openings 200, 202 may be sized with respective heights that are equal to or slightly smaller than diameters or heights of the corresponding cables 144, 154 such that the edges of the top and bottom cover members 127, 128 engage and slightly compress the cables 144, 154 when the cable connector 102 is assembled. The first opening 200 may be taller than the second opening 202 to accommodate a size difference between the cables 144 and the cables 154. In alternative embodiments, the shield interfaces 250 may be projections or tabs that extend from the cover 122 to engage the shield layers 150, 160, or the shield interfaces 250 may be a conductive material or adhesive, such as a solder material, that is applied between the edges of the cover members 127, 128 and the shield layers 150, 160 to electrically connect the cover 122 to the cables 144, 154.

In FIG. 4, the cross-section extends through the contact fingers 190 and the base 208 of the bus bar 186 that is engaged with and electrically connected to the ground lead 126B. The cross-section extends through the base 208, but not the fingers 190, of the bus bar 196, since the bus bar 196 is not configured to electrically connect to the signal lead 126A. In an embodiment, both bus bars 186, 196 are configured to be electrically connected to the cover 122 to provide a ground circuit between the bus bars 186, 196. The bus bars 186, 196 are carried by the cover 122, such that the bus bars 186, 196 are integral components of the cover 122 or are coupled directly or indirectly to the cover 122 and would move with movement of the cover 122. For example, the respective bases 208 of the bus bars 186, 196 may be discrete components that are directly secured to the top cover member 127 via a mechanical fastener, a conductive adhesive, or the like. In another embodiment, one or both of the bus bars 186, 196 may be integral to the top cover member 127. The contact fingers 190 may extend directly from the top cover member 127, and optionally may be stamped and formed out of the metal material of the top cover member 127.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A linking cable connector comprising:
a cover defining an interior cavity; and
a lead frame held in the interior cavity of the cover, the lead frame including a plurality of conductive leads arranged side by side in a row, the conductive leads extending a length between a first wire interface end and an opposite second wire interface end of the lead frame, at least some conductive leads defining first termination contact areas at least proximate to the first wire interface end of the lead frame and that are configured to engage and electrically connect to corresponding wire conductors of a first cable harness, the first termination contact areas of adjacent conductive leads spaced apart on a first lead pitch, the at least some conductive leads defining second termination contact areas at least proximate to the second wire interface end that are configured to engage and electrically connect to corresponding wire conductors of a second cable harness, the second termination contact areas of adjacent conductive leads spaced apart on a second lead pitch that is less than the first lead pitch, wherein the conductive leads are configured to provide conductive paths between the wire conductors of the first cable harness and the wire conductors of the second cable harness.

2. The linking cable connector of claim 1, wherein the lead frame defines a wide span region, a narrow span region, and a transition region that is disposed between the wide span region and the narrow span region along a longitudinal axis of the lead frame, the wide span region extending from the first wire interface end of the lead frame to the transition region, the narrow span region extending from the transition region to the second wire interface end of the lead frame, wherein the at least some adjacent conductive leads are spaced on the first lead pitch along the wide span region and the at least some adjacent conductive leads are spaced on the second lead pitch along the narrow span region.

3. The linking cable connector of claim 2, wherein the conductive leads along the wide span region and the conductive leads along the narrow span region extend parallel to the longitudinal axis, at least most of the conductive leads along the transition region extend non-parallel to the longitudinal axis.

4. The linking cable connector of claim 2, wherein adjacent conductive leads in the lead frame extend parallel to one another along the wide span region and along the narrow span region, the adjacent conductive leads extending at acute angles relative to one another along the transition region.

5. The linking cable connector of claim 2, wherein the transition region of the lead frame extends between a wide end and an opposite narrow end, a width of the transition region along a lateral axis of the lead frame being greater at the wide end relative to the width of the transition region at the narrow end, the at least some adjacent conductive leads being spaced on the first lead pitch at the wide end of the transition region, the at least some adjacent conductive leads being spaced on the second lead pitch at the narrow end of the transition region, the conductive leads extending linearly between the wide end and the narrow end.

6. The linking cable connector of claim 2, wherein the lead frame defines a center longitudinal axis that bisects a width of the lead frame between a first outer lead on a first side of the center longitudinal axis and a second outer lead on an opposite second side of the center longitudinal axis, wherein, in the transition region, the conductive leads in a first subset of leads disposed on the first side of the center longitudinal axis have positive slopes relative to the center longitudinal axis, the conductive leads in a second subset of leads disposed on the second side of the center longitudinal axis having negative slopes relative to the center longitudinal axis.

7. The linking cable connector of claim 6, wherein, in the transition region of the lead frame, the conductive leads of the first and second subsets of leads have progressively increasing angle magnitudes relative to the center longitudinal axis with increasing distance of the conductive leads from the center longitudinal axis such that the first and second outer leads have the largest angles relative to the center longitudinal axis.

8. The linking cable connector of claim 1, wherein the cover is formed of an electrically conductive metal material, the cover having shield interfaces configured to engage one or more shielding elements of the first cable harness at the first cable end of the cover and one or more shielding elements of the second cable harness at the second cable end of the cover to electrically connect the cover to the shielding elements of the first and second cable harnesses.

9. The linking cable connector of claim 1, wherein the conductive leads define signal leads and ground leads arranged in a repeating pattern along the row, the signal leads configured to engage and electrically connect to signal conductors of the wire conductors of the first and second cable harnesses, the ground leads configured to engage and electrically connect to ground conductors of the wire conductors of the first and second cable harnesses, the ground leads engaging and electrically connecting to at least one ground bus bar carried by the cover.

10. The linking cable connector of claim 1, wherein the conductive leads define signal leads and ground leads arranged in a repeating pattern along the row that includes at least one ground lead disposed between adjacent pairs of signal leads, the signal leads configured to engage and electrically connect to signal conductors of the wire conductors of the first and second cable harnesses, the signal leads in each pair being spaced on the first lead pitch at mating interfaces between the signal leads and the signal conductors of one cable in the first cable harness, the signal leads in each pair being spaced on the second lead pitch at mating interfaces between the signal leads and the signal conductors of one cable in the second cable harness.

11. The linking cable connector of claim 1, wherein the conductive leads of the lead frame are formed of a metal material and are at least partially overmolded in a dielectric material that engages the cover.

12. The linking cable connector of claim 1, wherein a contact spacing between adjacent conductive leads in the row is greater at the first termination contact areas than at the second termination contact areas.

13. A linking cable connector comprising:
a cover defining an interior cavity; and
a lead frame held in the interior cavity of the cover, the lead frame extending along a longitudinal axis between a first wire interface end and an opposite second wire interface end, the lead frame defining a wide span region that includes the first wire interface end, a narrow span region that includes the second wire interface end, and a transition region disposed between the wide span region and the narrow span region along the longitudinal axis, the lead frame including a plurality of conductive leads arranged side by side in a row along a lateral axis, the conductive leads extending between the first and second wire interface ends of the lead frame, at least some adjacent conductive leads being spaced on a first lead pitch along the wide span region and the at least some adjacent conductive leads being spaced on a second lead pitch along the narrow span region, the second lead pitch being less than the first lead pitch, wherein the conductive leads along the wide span region are configured to engage and electrically connect to corresponding wire conductors of a first cable harness and the conductive leads along the narrow span region are configured to engage and electrically connect to corresponding wire conductors of a second cable harness such that the conductive leads provide conductive paths between the wire conductors of the first cable harness and the wire conductors of the second cable harness.

14. The linking cable connector of claim 13, wherein the wide span region and the narrow span region of the lead frame each includes a respective cable subsection and a respective bus bar subsection, the bus bar subsection of each of the wide span region and the narrow span region being disposed between the transition region of the lead frame and the respective cable subsection, the conductive leads along the cable subsections defining contact areas for engaging and electrically connecting to corresponding wire conductors of the respective first and second cable harnesses, a subset of the conductive leads designated as ground leads being electrically connected to a bus bar carried by the cover along at least one of the bus bar subsections.

15. The linking cable connector of claim 13, wherein the transition region of the lead frame extends between a wide end and an opposite narrow end, a width of the transition region along the lateral axis being greater at the wide end relative to the width of the transition region at the narrow end, the at least some adjacent conductive leads being spaced on the first lead pitch at the wide end of the transition region, the at least some adjacent conductive leads being spaced on the second lead pitch at the narrow end of the transition region, the conductive leads extending linearly between the wide end and the narrow end.

16. The linking cable connector of claim 13, wherein the longitudinal axis is a center longitudinal axis that bisects a width of the lead frame between a first outer lead on a first side of the center longitudinal axis and a second outer lead on an opposite second side of the center longitudinal axis, wherein, in the transition region, the conductive leads in a first subset of leads disposed on the first side of the center longitudinal axis extend non-parallel to the center longitudinal axis and non-parallel to one another, and the conductive leads in a second subset of leads disposed on the second side of the center longitudinal axis extend non-parallel to the center longitudinal axis and non-parallel to one another.

17. The linking cable connector of claim 13, wherein the cover extends between a first cable end and a second cable end, the interior cavity extending through the cover between a first opening at the first cable end and a second opening at the second cable end, the lead frame held between the first and second cable ends of the cover, the first opening configured to receive the first cable harness, the second opening configured to receive the second cable harness, the cover defining a wide section that includes the first cable end and a narrow section that includes the second cable end, the wide span region of the lead frame being held along the wide section of the cover, the narrow span region of the lead frame being held along the narrow section of the cover.

18. A linking cable connector comprising:
a cover defining an interior cavity; and
an array of electrical conductors held in the interior cavity of the cover, the array of electrical conductors extending longitudinally between a first wire interface end and an opposite second wire interface end, the array of conductors defining a wide span region that includes the first wire interface end, a narrow span region that includes the second wire interface end, and a transition region disposed between the wide span region and the narrow span region, the electrical conductors in the array each extending the length of the array between the first wire interface end and the second wire interface end and being laterally spaced apart from one another in a row, the electrical conductors along the wide span region having a first pitch between adjacent electrical conductors and the electrical conductors along the narrow span region having a second pitch between adjacent electrical conductors that is less than the first pitch, wherein the transition region extends between a wide end and an opposite narrow end, the electrical conductors at the wide end having the first pitch between adjacent electrical conductors, the electrical conductors at the narrow end having the second pitch between adjacent electrical conductors, the electrical conductors extending linearly between the wide end and the narrow end, wherein the electrical conductors along the wide span region are configured to engage and electrically connect to corresponding wire conductors of a first cable harness and the electrical conductors along the narrow span region are configured to engage and electrically connect to corresponding wire conductors of a second cable harness such that each electrical conductor provides a conductive path between one of the wire conductors of the first cable harness and a corresponding wire conductor of the second cable harness.

19. The linking cable connector of claim 18, wherein the array of electrical conductors is an array of electrical traces along one side of a printed circuit board.

20. The linking cable connector of claim 18, wherein the array of electrical conductors is an array of conductive leads of an overmolded lead frame.

* * * * *